United States Patent
Aziz et al.

(10) Patent No.: US 11,508,890 B2
(45) Date of Patent: Nov. 22, 2022

(54) COLLIMATION OF LIGHT EMITTED BY LIGHT EMITTING DIODES USING WALLS EXTENDING THROUGH TRANSPARENT SEMICONDUCTOR

(71) Applicant: Meta Platforms Technologies, LLC, Menlo Park, CA (US)

(72) Inventors: Mohsin Aziz, Plymouth (GB); Jun-Youn Kim, Plymouth (GB); Samir Mezouari, Swindon (GB); Abdul Shakoor, Plymouth (GB); James Walker Carswell, Plymouth (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 46 days.

(21) Appl. No.: 17/214,727

(22) Filed: Mar. 26, 2021

(65) Prior Publication Data
US 2022/0310891 A1    Sep. 29, 2022

(51) Int. Cl.
| H01L 33/60 | (2010.01) |
| H01L 25/075 | (2006.01) |
| G02B 27/01 | (2006.01) |
| H01L 33/50 | (2010.01) |

(52) U.S. Cl.
CPC .......... *H01L 33/60* (2013.01); *G02B 27/0172* (2013.01); *H01L 25/0753* (2013.01); *H01L 33/507* (2013.01); *G02B 2027/0178* (2013.01); *H01L 2933/0058* (2013.01)

(58) Field of Classification Search
CPC ... H01L 33/60; H01L 33/507; H01L 25/0753; H01L 2933/0058; G02B 27/0172; G02B 2027/0178
See application file for complete search history.

(56) References Cited

U.S. PATENT DOCUMENTS

| 2014/0361321 | A1 | 12/2014 | Saito et al. |
| 2018/0083170 | A1* | 3/2018 | Shepherd ............... H01L 33/58 |
| 2019/0189682 | A1 | 6/2019 | Young et al. |
| 2020/0083399 | A1 | 3/2020 | Henry et al. |
| 2021/0055327 | A1 | 2/2021 | Sengul et al. |

FOREIGN PATENT DOCUMENTS

CN    114429965 A  *  5/2022  ............... G09G 3/32

OTHER PUBLICATIONS

International Search Report and Written Opinion for International Application No. PCT/US2022/021755, dated Jul. 6, 2022, 10 pages.

* cited by examiner

*Primary Examiner* — Mary Ellen Bowman
(74) *Attorney, Agent, or Firm* — Fenwick & West LLP

(57) ABSTRACT

A display device includes a plurality of light emitting diodes (LEDs) having walls that extend through a transparent semiconductor layer and beyond the surface of the transparent semiconductor layer. Each of the walls surrounds at least part of each of the plurality of LEDs to collimate the light emitted by the plurality of LEDs. In some embodiments, the walls collimate the light emitted by the LEDs by reflecting the light or absorbing a portion of the light. The display device may further include an array of optical lenses that faces the surface of the transparent semiconductor layer to further collimate the light emitted from the LEDs.

20 Claims, 13 Drawing Sheets

EMIT LIGHT THROUGH A SURFACE OF A TRANSPARENT SEMICONDUCTOR LAYER BY A PLURALITY OF LIGHT EMITTING DIODES (LEDS) COMPRISING A PART OF THE TRANSPARENT SEMICONDUCTOR LAYER
910

COLLIMATE THE LIGHT EMITTED BY THE PLURALITY OF LEDS BY WALLS EXTENDING THROUGH THE TRANSPARENT SEMICONDUCTOR LAYER AND BEYOND THE SURFACE OF THE TRANSPARENT SEMICONDUCTOR LAYER
920

COLLIMATION OF LIGHT EMITTED BY LIGHT EMITTING DIODES USING WALLS EXTENDING THROUGH TRANSPARENT SEMICONDUCTOR

BACKGROUND

This disclosure relates generally to light emitting diodes (LEDs), and more specifically to collimation of light emitted by LEDs.

LEDs are used as light sources in many electronic display devices, such as televisions, computer monitors, laptop computers, tablets, smartphones, projection systems, and head-mounted devices (e.g., virtual reality (VR) devices, augmented reality (AR) devices, and/or mixed-reality (MR) devices). However, LEDs typically emit light in a Lambertian-like distribution and the divergence of the light to be too significant for imaging applications. Improved techniques for reducing divergence of light emitted from LEDs in electronic display devices are needed.

SUMMARY

Embodiments relate to collimation of light emitted from LEDs by using walls surrounding the LEDs. Specifically, the LEDs emit light beams through a surface of a transparent semiconductor layer. The walls extend through the transparent semiconductor layer and extends beyond the surface of the transparent semiconductor layer. A wall surrounds at least a part of the corresponding LED and collimates the light beam emitted by the corresponding LED. The wall absorbs and/or reflects at least part of the light beam to reduce in the divergence of the light beam.

In some embodiments, a wall is coated with a metal layer. The metal layer collimates the light beam of the LED corresponding to the wall, and also deliver electrical power to the corresponding LED. The wall may also include a color converting material, such as semiconductor quantum dots.

In some embodiments, the light emitted by the LEDs is further collimated by an array of optical lenses. Each optical lens faces a LED and focuses the light emitted by the LED in a direction along the focal axis of the optical lens to further reduce the divergence angle of the light. The focal axis of the optical lens can be perpendicular to the surface of the transparent semiconductor layer. The array is formed with indentations between the optical lenses to receive the walls for aligning the array optical lenses with the LEDs.

In some embodiments, the walls are formed as surfaces of a plurality of openings that partially penetrate through the transparent semiconductor layer and penetrate entirely through another transparent semiconductor layer. A layer of metal is formed on the inner surface of each opening. Each opening is then filled. A portion of the transparent semiconductor layer is removed to reveal a portion of the walls.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to a display assembly that includes a plurality of LEDs emitting light and a plurality of walls collimating the light by reflecting and/or absorbing a portion of the light. The display assembly can be used to display image light, e.g., in a near-eye display of an artificial reality system. The display assembly includes a part of a transparent semiconductor layer, a portion of which partially forms the LEDs. The light emitted by the LEDs can have a divergence that is too significant for imaging. The walls extend through the transparent semiconductor layer and beyond the surface of the transparent semiconductor layer. Each wall surrounds at least a part of a respective LED to collimate the light emitted by the respective LED to reduce the divergence in the light. The display assembly may also include an array of optical lenses for further collimating light emitted by the LEDs.

Figure 1:
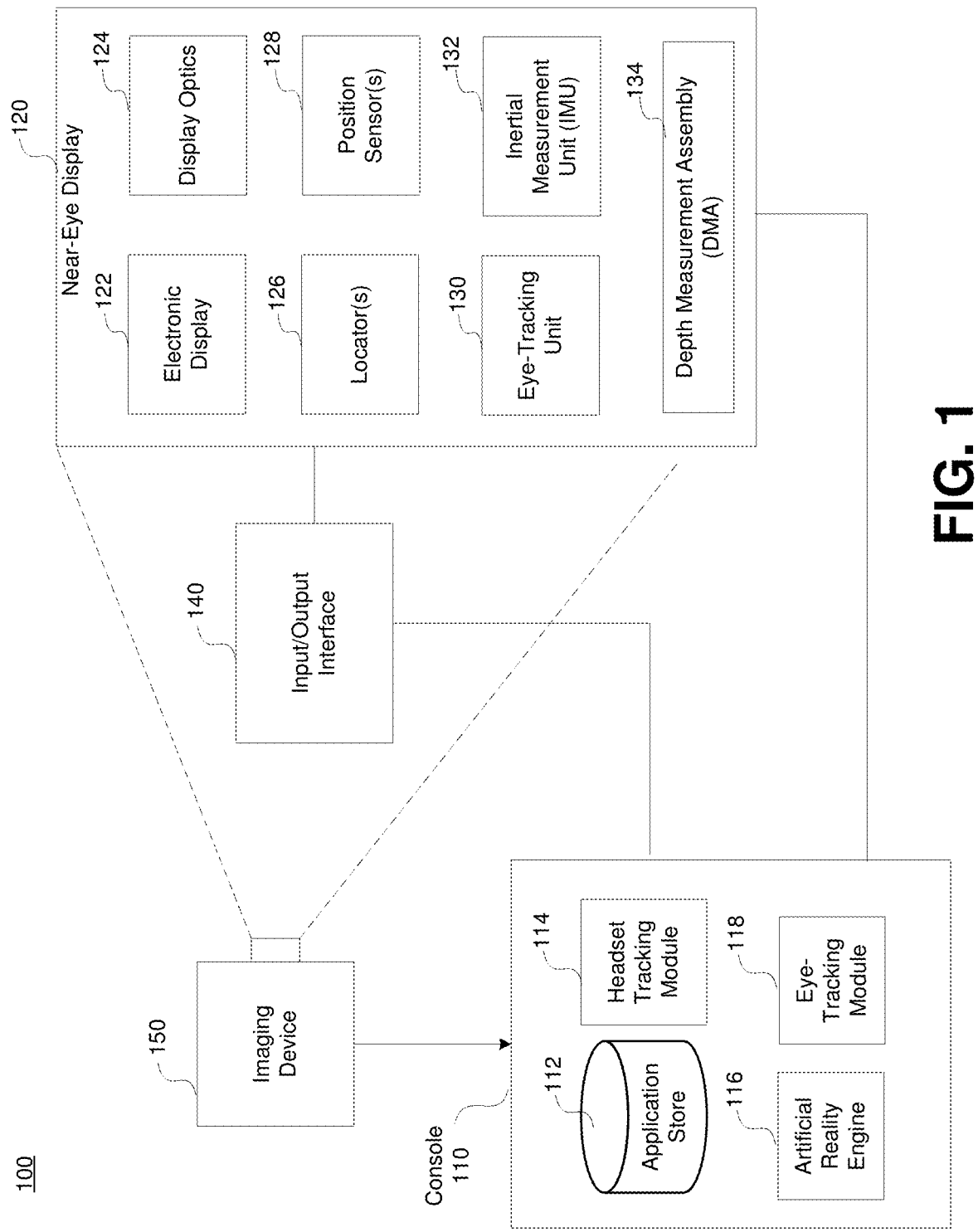
FIG. 1 is a block diagram of an artificial reality system including a near-eye display, in accordance with one or more embodiments.

FIG. 1 is a block diagram of an artificial reality system 100 including a near-eye display 120, in accordance with one or more embodiments. The artificial reality system environment 100 shown in FIG. 1 may include the near-eye display 120, an optional external imaging device 150, and an optional input/output interface 140, each of which may be coupled to an optional console 110. While FIG. 1 shows an example of the artificial reality system environment 100 including one near-eye display 120, one external imaging device 150, and one input/output interface 140, any number of these components may be included in the artificial reality system environment 100, or any of the components may be omitted. For example, there may be multiple near-eye displays 120 monitored by one or more external imaging devices 150 in communication with a console 110. In some configurations, the artificial reality system environment 100 may not include the external imaging device 150, the optional input/output interface 140, and the optional console 110. In alternative configurations, different or additional components may be included in the artificial reality system environment 100.

The near-eye display 120 may be a head-mounted display that presents content to a user. Examples of content presented by the near-eye display 120 include one or more of images, videos, audio, or any combination thereof. In some embodiments, audio may be presented via an external device (e.g., speakers and/or headphones) that receives audio information from the near-eye display 120, the console 110, or both, and presents audio data based on the audio information. The near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, the near-eye display 120 may be implemented in any suitable form-factor, including a pair of glasses. Some embodiments of the near-eye display 120 are further described below with respect to FIGS. 2 and 3. Additionally, in various embodiments, the functionality described herein may be used in a headset that combines images of an environment external to the near-eye display 120 and artificial reality content (e.g., computer-generated images). Therefore, the near-eye display 120 may augment images of a physical, real-world environment external to the near-eye display 120 with generated content (e.g., images, video, sound, etc.) to present an augmented reality to a user.

In various embodiments, the near-eye display 120 may include one or more of electronic display 122, display optics 124, an eye-tracking unit 130, one or more locators 126, one or more position sensors 128, and an inertial measurement unit (IMU) 132, and a depth measurement assembly (DMA) 134. The near-eye display 120 may omit any of the eye-tracking unit 130, the locators 126, the position sensors 128, and the IMU 132, or include additional elements in various embodiments. Additionally, in some embodiments, the near-eye display 120 may include elements combining the function of various elements described in conjunction with FIG. 1.

The electronic display 122 may display or facilitate the display of images to the user according to data received from, for example, the console 110. In various embodiments, the electronic display 122 may include one or more display panels, such as a liquid crystal display (LCD), an organic light emitting diode (OLED) display, an inorganic light emitting diode (ILED) display, a micro light emitting diode (micro-LED) display, an active-matrix OLED display (AMOLED), a transparent OLED display (TOLED), or some other display. For example, in one implementation of the near-eye display 120, the electronic display 122 may include a front TOLED panel, a rear display panel, and an optical component (e.g., an attenuator, polarizer, or diffractive or spectral film) between the front and rear display panels. The electronic display 122 may include pixels to emit light of a predominant color such as red, green, blue, white, or yellow. In some implementations, the electronic display 122 may display a three-dimensional (3D) image through stereoscopic effects produced by two-dimensional (2D) panels to create a subjective perception of image depth. For example, the electronic display 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, the display optics 124 may display image content optically (e.g., using optical waveguides and couplers) or magnify image light received from the electronic display 122, correct optical errors associated with the image light, and present the corrected image light to a user of the near-eye display 120. In various embodiments, the display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from the electronic display 122. The display optics 124 may include a combination of different optical elements as well as mechanical couplings to maintain relative spacing and orientation of the optical elements in the combination. One or more optical elements in the display optics 124 may have an optical coating, such as an anti-reflective coating, a reflective coating, a filtering coating, or a combination of different optical coatings.

Magnification of the image light by the display optics 124 may allow the electronic display 122 to be physically smaller, weigh less, and consume less power than larger displays. Additionally, magnification may increase a field of view of the displayed content. The amount of magnification of image light by the display optics 124 may be changed by adjusting, adding, or removing optical elements from the display optics 124. In some embodiments, the display optics 124 may project displayed images to one or more image planes that may be further away from the user's eyes than the near-eye display 120.

The display optics 124 may also be designed to correct one or more types of optical errors, such as 2D optical errors, 3D optical errors, or any combination thereof. Two-dimensional errors may include optical aberrations that occur in two dimensions. Example types of 2D errors may include barrel distortion, pincushion distortion, longitudinal chromatic aberration, and transverse chromatic aberration. Three-dimensional errors may include optical errors that occur in three dimensions. Example types of 3D errors may include spherical aberration, comatic aberration, field curvature, and astigmatism.

The locators 126 may be objects located in specific positions on the near-eye display 120 relative to one another and relative to a reference point on the near-eye display 120. In some implementations, the console 110 may identify the locators 126 in images captured by the external imaging device 150 to determine the artificial reality headset's position, orientation, or both. A locator 126 may be an LED, a corner cube reflector, a reflective marker, a type of light source that contrasts with an environment in which the near-eye display 120 operates, or any combination thereof. In embodiments where the locators 126 are active components (e.g., LEDs or other types of light emitting devices), the locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

The external imaging device 150 may include one or more cameras, one or more video cameras, any other device capable of capturing images including one or more of the locators 126, or any combination thereof. Additionally, the external imaging device 150 may include one or more filters (e.g., to increase signal to noise ratio). The external imaging device 150 may be configured to detect light emitted or reflected from the locators 126 in a field of view of the external imaging device 150. In embodiments where the locators 126 include passive elements (e.g., retroreflectors), the external imaging device 150 may include a light source that illuminates some or all of the locators 126, which may retro-reflect the light to the light source in the external imaging device 150. Slow calibration data may be communicated from the external imaging device 150 to the console 110, and the external imaging device 150 may receive one or more calibration parameters from the console 110 to adjust one or more imaging parameters (e.g., focal length, focus, frame rate, sensor temperature, shutter speed, aperture, etc.).

The position sensors 128 may generate one or more measurement signals in response to motion of the near-eye display 120. Examples of position sensors 128 may include accelerometers, gyroscopes, magnetometers, other motion-detecting or error-correcting sensors, or any combination thereof. For example, in some embodiments, the position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

The IMU 132 may be an electronic device that generates fast calibration data based on measurement signals received from one or more of the position sensors 128. The position sensors 128 may be located external to the IMU 132, internal to the IMU 132, or any combination thereof. Based on the one or more measurement signals from one or more position sensors 128, the IMU 132 may generate fast calibration data indicating an estimated position of the near-eye display 120 relative to an initial position of the near-eye display 120. For example, the IMU 132 may integrate measurement signals received from accelerometers over time to estimate a velocity vector and integrate the velocity vector over time to determine an estimated position of a reference point on the near-eye display 120. Alternatively, the IMU 132 may provide the sampled measurement signals to the console 110, which may determine the fast calibration data. While the reference point may generally be defined as a point in space, in various embodiments, the reference point may also be defined as a point within the near-eye display 120 (e.g., a center of the IMU 132).

The eye-tracking unit 130 may include one or more eye-tracking systems. Eye tracking may refer to determining an eye's position, including orientation and location of the eye, relative to the near-eye display 120. An eye-tracking system may include an imaging system to image one or more eyes and may optionally include a light emitter, which may generate light that is directed to an eye such that light reflected by the eye may be captured by the imaging system. For example, the eye-tracking unit 130 may include a non-coherent or coherent light source (e.g., a laser diode) emitting light in the visible spectrum or infrared spectrum, and a camera capturing the light reflected by the user's eye. As another example, the eye-tracking unit 130 may capture reflected radio waves emitted by a miniature radar unit. The eye-tracking unit 130 may use low-power light emitters that emit light at frequencies and intensities that would not injure the eye or cause physical discomfort. The eye-tracking unit 130 may be arranged to increase contrast in images of an eye captured by the eye-tracking unit 130 while reducing the overall power consumed by the eye-tracking unit 130 (e.g., reducing power consumed by a light emitter and an imaging system included in the eye-tracking unit 130). For example, in some implementations, the eye-tracking unit 130 may consume less than 100 milliwatts of power.

The near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, the eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

The DMA 134 determines depth information of objects in a local area surrounding the near-eye display 120. For example, the DMA 134 includes an illuminator assembly that illuminates the objects with structured light, a depth camera assembly that captures image data of the illuminated objects in synchronization with the illuminator assembly, and a controller that determines depth information of the objects based on the captured image data. The controller can also control the illuminator assembly and depth camera assembly. In some other embodiments, the functions of the DMA 134 described FIG. 1 may be distributed among other components in the artificial reality system 100 in different manners in other embodiments. For example, some or all of the functionality provided by the controller of the DMA 134 may be performed by the console 110. Alternatively, some of the control and processing modules of the DMA 134 are part of the near-eye display 120, and others are part of the console 110.

The input/output interface 140 may be a device that allows a user to send action requests to the console 110. An action request may be a request to perform a particular action. For example, an action request may be to start or to end an application or to perform a particular action within the application. The input/output interface 140 may include one or more input devices. Example input devices may include a keyboard, a mouse, a game controller, a glove, a button, a touch screen, or any other suitable device for receiving action requests and communicating the received action requests to the console 110. An action request received by the input/output interface 140 may be communicated to the console 110, which may perform an action corresponding to the requested action. In some embodiments, the input/output interface 140 may provide haptic feedback to the user in accordance with instructions received from the console 110. For example, the input/output interface 140 may provide haptic feedback when an action request is received, or when the console 110 has performed a requested action and communicates instructions to the input/output interface 140. In some embodiments, the external imaging device 150 may be used to track the input/output interface 140, such as tracking the location or position of a controller (which may include, for example, an IR light source) or a hand of the user to determine the motion of the user. In some embodiments, the near-eye display 120 may include one or more imaging devices to track the input/output interface 140, such as tracking the location or position of a controller or a hand of the user to determine the motion of the user.

The console 110 may provide content to the near-eye display 120 for presentation to the user in accordance with information received from one or more of the external imaging device 150, the near-eye display 120, and the input/output interface 140. In the example shown in FIG. 1, the console 110 may include an application store 112, a headset tracking module 114, an artificial reality engine 116, and an eye-tracking module 118. Some embodiments of the console 110 may include different or additional modules than those described in conjunction with FIG. 1. Functions further described below may be distributed among components of the console 110 in a different manner than is described here.

In some embodiments, the console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of the console 110 described in conjunction with FIG. 1 may be encoded as instructions in the non-transitory computer-readable storage medium that, when executed by the processor, cause the processor to perform the functions further described below.

The application store 112 may store one or more applications for execution by the console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

The headset tracking module 114 may track movements of the near-eye display 120 using slow calibration information from the external imaging device 150. For example, the headset tracking module 114 may determine positions of a reference point of the near-eye display 120 using observed locators from the slow calibration information and a model of the near-eye display 120. The headset tracking module 114 may also determine positions of a reference point of the near-eye display 120 using position information from the fast calibration information. Additionally, in some embodiments, the headset tracking module 114 may use portions of the fast calibration information, the slow calibration information, or any combination thereof, to predict a future location of the near-eye display 120. The headset tracking module 114 may provide the estimated or predicted future position of the near-eye display 120 to the artificial reality engine 116.

The artificial reality engine 116 may execute applications within the artificial reality system environment 100 and receive position information of the near-eye display 120, acceleration information of the near-eye display 120, velocity information of the near-eye display 120, predicted future positions of the near-eye display 120, or any combination thereof from the headset tracking module 114. The artificial reality engine 116 may also receive estimated eye position and orientation information from the eye-tracking module 118. Based on the received information, the artificial reality engine 116 may determine content to provide to the near-eye display 120 for presentation to the user. For example, if the received information indicates that the user has looked to the left, the artificial reality engine 116 may generate content for the near-eye display 120 that mirrors the user's eye movement in a virtual environment. Additionally, the artificial reality engine 116 may perform an action within an application executing on the console 110 in response to an action request received from the input/output interface 140, and provide feedback to the user indicating that the action has been performed. The feedback may be visual or audible feedback via the near-eye display 120 or haptic feedback via the input/output interface 140.

The eye-tracking module 118 may receive eye-tracking data from the eye-tracking unit 130 and determine the position of the user's eye based on the eye tracking data. The position of the eye may include an eye's orientation, location, or both relative to the near-eye display 120 or any element thereof. Because the eye's axes of rotation change as a function of the eye's location in its socket, determining the eye's location in its socket may allow the eye-tracking module 118 to more accurately determine the eye's orientation.

Figure 2:
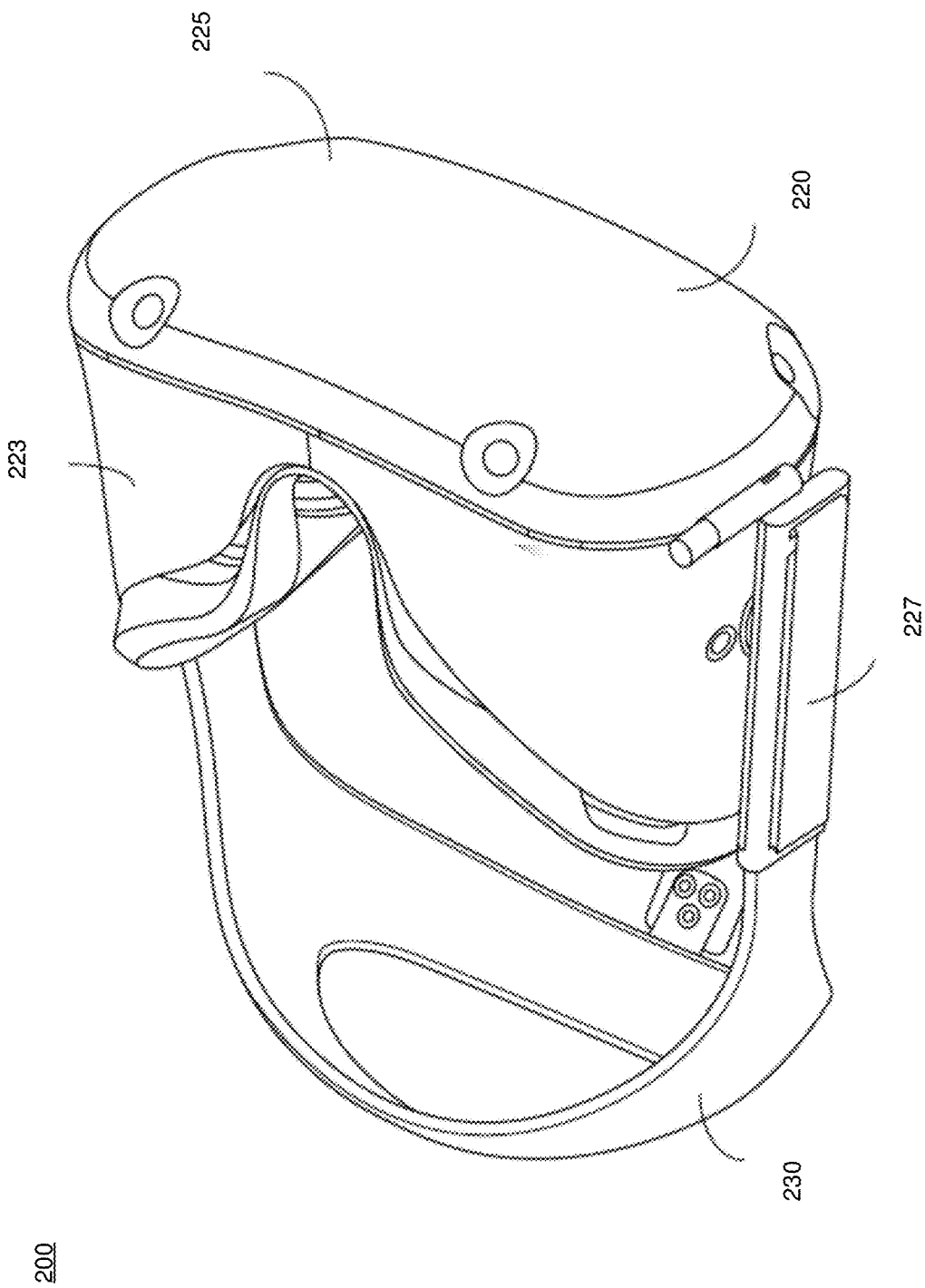
FIG. 2 is a perspective view of a near-eye display in the form of a head-mounted display (HMD) device, in accordance with one or more embodiments.

FIG. 2 is a perspective view of a near-eye display in the form of a head-mounted display (HMD) device 200, in accordance with one or more embodiments. The HMD device 200 may be a part of, e.g., a VR system, an AR system, an MR system, or any combination thereof. The HMD device 200 may include a body 220 and a head strap 230. FIG. 2 shows a bottom side 223, a front side 225, and a left side 227 of the body 220 in the perspective view. The head strap 230 may have an adjustable or extendible length. There may be a sufficient space between the body 220 and the head strap 230 of the HMD device 200 for allowing a user to mount the HMD device 200 onto the user's head. In various embodiments, the HMD device 200 may include additional, fewer, or different components. For example, in some embodiments, the HMD device 200 may include eyeglass temples and temple tips as shown in, for example, FIG. 3 below, rather than the head strap 230.

The HMD device 200 may present to a user media including virtual and/or augmented views of a physical, real-world environment with computer-generated elements. Examples of the media presented by the HMD device 200 may include images (e.g., 2D or 3D images), videos (e.g., 2D or 3D videos), audio, or any combination thereof. The images and videos may be presented to each eye of the user by one or more display assemblies (not shown in FIG. 2) enclosed in the body 220 of the HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a micro-LED display, an AMOLED, a TOLED, some other display, or any combination thereof. The HMD device 200 may include two eye box regions.

In some implementations, the HMD device 200 may include various sensors (not shown), such as depth sensors, motion sensors, position sensors, and eye tracking sensors. Some of these sensors may use a structured light pattern for sensing. In some implementations, the HMD device 200 may include an input/output interface for communicating with a console. In some implementations, the HMD device 200 may include a virtual reality engine (not shown) that can execute applications within the HMD device 200 and receive depth information, position information, acceleration information, velocity information, predicted future positions, or any combination thereof of the HMD device 200 from the various sensors. In some implementations, the information received by the virtual reality engine may be used for producing a signal (e.g., display instructions) to the one or more display assemblies. In some implementations, the HMD device 200 may include locators (not shown, such as the locators 126) located in fixed positions on the body 220 relative to one another and relative to a reference point. Each of the locators may emit light that is detectable by an external imaging device.

Figure 3:
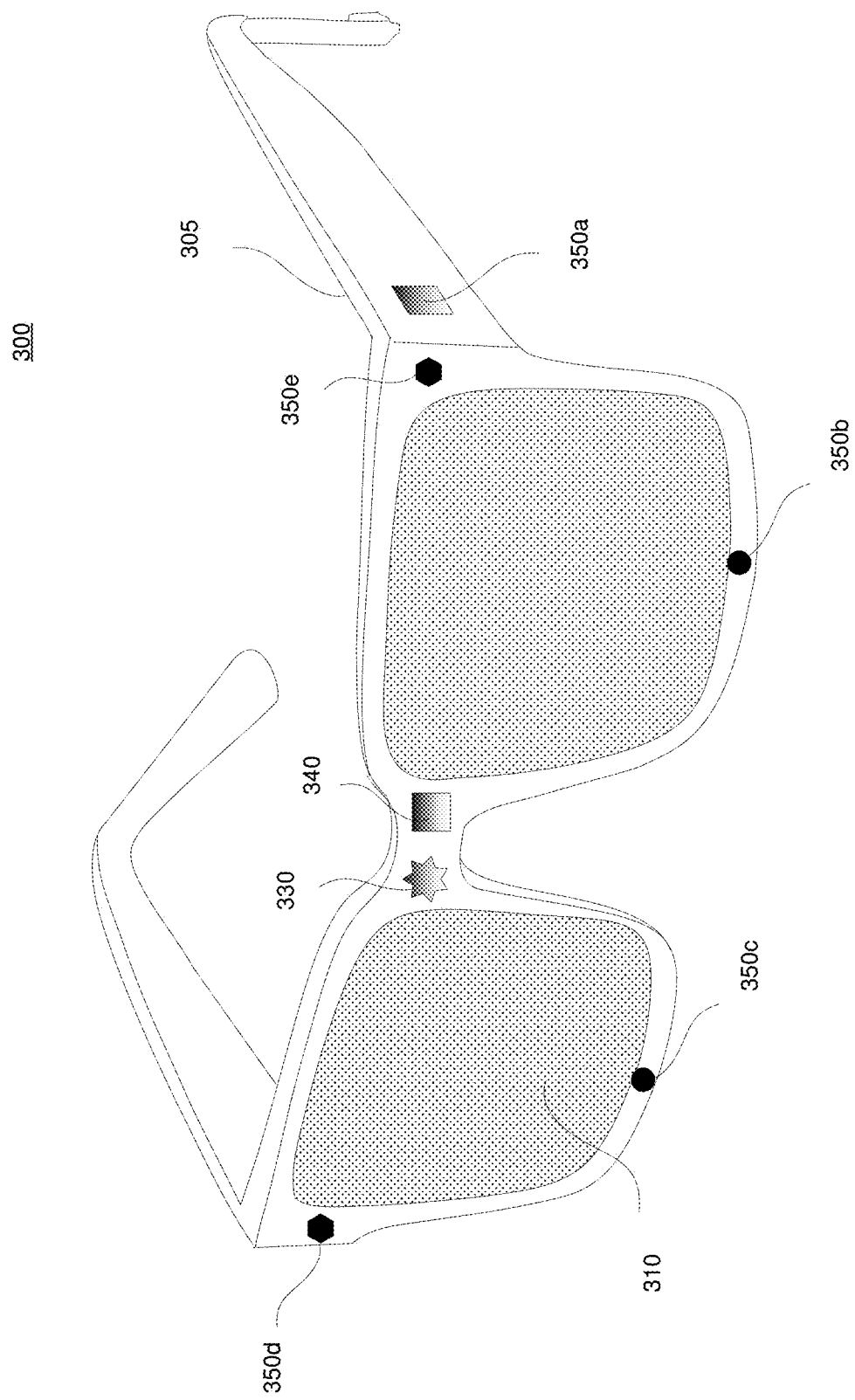
FIG. 3 is a perspective view of a near-eye display in the form of a pair of glasses, in accordance with one or more embodiments.

FIG. 3 is a perspective view of a near-eye display 300 in the form of a pair of glasses, in accordance with one or more embodiments. The near-eye display 300 may be a specific implementation of the near-eye display 120 of FIG. 1, and may be configured to operate as a VR display, an AR display, and/or a MR display. The near-eye display 300 may include a frame 305 and a display 310. The display 310 may be configured to present content to a user. In some embodiments, the display 310 may include display electronics and/or display optics. For example, as described above with respect to the near-eye display 120 of FIG. 1, the display 310 may include an LCD display panel, an LED display panel, or an optical display panel (e.g., a waveguide display assembly).

The near-eye display 300 may further include various sensors 350a, 350b, 350c, 350d, and 350e on or within the frame 305. In some embodiments, the sensors 350a-350e may include one or more depth sensors, motion sensors, position sensors, inertial sensors, or ambient light sensors. In some embodiments, the sensors 350a-350e may include one or more image sensors configured to generate image data representing different fields of views in different directions. In some embodiments, the sensors 350a-350e may be used as input devices to control or influence the displayed content of the near-eye display 300, and/or to provide an interactive VR/AR/MR experience to a user of the near-eye display 300. In some embodiments, the sensors 350a-350e may also be used for stereoscopic imaging.

In some embodiments, the near-eye display 300 may further include one or more illuminators 330 to project light into the physical environment. The projected light may be associated with different frequency bands (e.g., visible light, infra-red light, ultra-violet light, etc.), and may serve various purposes. For example, the illuminator(s) 330 may project light in a dark environment (or in an environment with low intensity of infra-red light, ultra-violet light, etc.) to assist the sensors 350a-350e in capturing images of different objects within the dark environment. In some embodiments, the illuminator(s) 330 may be used to project certain light pattern onto the objects within the environment. In some embodiments, the illuminator(s) 330 may be used as locators, such as the locators 126 described above with respect to FIG. 1.

In some embodiments, the near-eye display 300 may also include a high-resolution camera 340. The camera 340 may capture images of the physical environment in the field of view. The captured images may be processed, for example, by a virtual reality engine (e.g., the artificial reality engine 116 of FIG. 1) to add virtual objects to the captured images or modify physical objects in the captured images, and the processed images may be displayed to the user by the display 310 for AR or MR applications.

Figure 4:
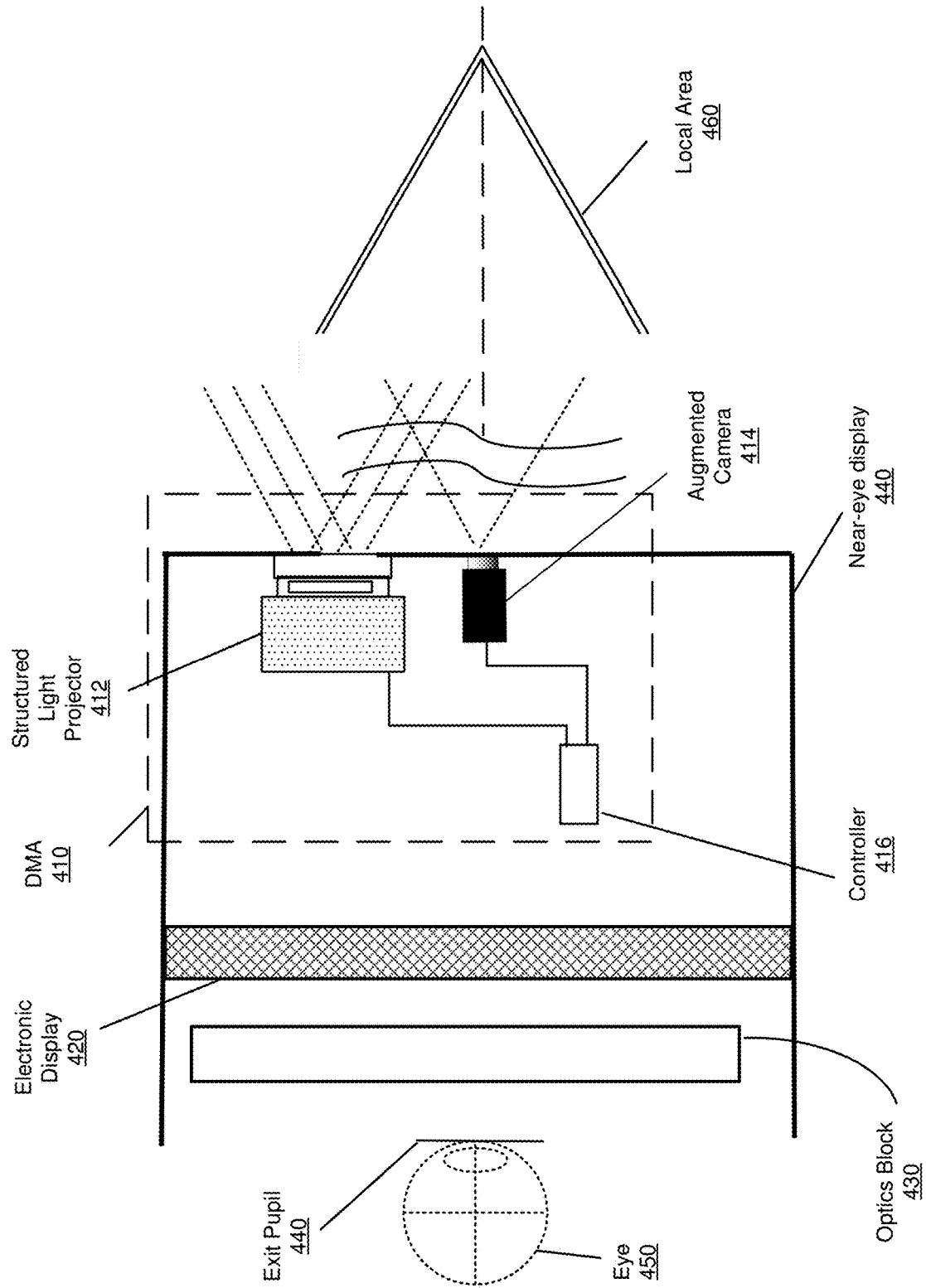
FIG. 4 illustrates a cross section of a near-eye display, in accordance with an embodiment.

FIG. 4 illustrates a cross section of a near-eye display 400, in accordance with an embodiment. The near-eye display 400 includes a DMA 410, an electronic display 420, and an optics block 430. Some embodiments of the near-eye display 400 have different components than those described here. Similarly, in some cases, functions can be distributed among the components in a different manner than is described here. The near-eye display 400 also includes an eyebox 440 where an eye 450 of a user would be located. For purposes of illustration, FIG. 4 shows a cross section of the near-eye display 400 in accordance with a single eye 450. Although FIG. 4 depicts a center cross-section of the eye 450 as being in the same plane as the DMA 410, the center cross-section of the eye 450 and the DMA 410 do not have to be in the same plane. Additionally, another electronic display and optics block, separate from those shown in FIG. 4, may be included in the near-eye display 400 to present content, such as an augmented representation of a local area 460 or virtual content, to another eye of the user.

The DMA 410 includes a structured light projector 412, a depth camera assembly 414, and a controller 416. The structured light projector 412 illuminates the local area 460 with structured light. The depth camera assembly 414 captures images of the local area 460 in synchronization with the pulses of structured light and outputs image data to the controller 416.

In some embodiments, the controller 416 is configured to determine depth information for objects in the local area 460 using image data from the depth camera 414. The controller 416 also controls how structured light is projected by the structured light projector 412 and how the depth camera assembly 414 captures image light. For example, the controller instructs the structured light projector 412 to project the structured light and instructs the depth camera assembly 414 to capture the image data by capturing structured light reflected from the objects illuminated with the structured light projected by the structured light projector 412. In alternate embodiments, some other device (e.g., a console) determines depth information for the local area 460.

The electronic display 420 displays images (e.g., 4D or 3D images) to the user. In various embodiments, the electronic display 420 comprises a single electronic display panel or multiple electronic display panels (e.g., a display for each eye of a user). Examples of an electronic display panel include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, some other display, or some combination thereof.

In some embodiments, the electronic display 420 includes a plurality of LEDs (e.g., micro-LEDs) and a plurality of walls. Each wall surrounds a part of a LED. A part of light emitted from the LED reaches an inner surface of the wall. A coating on the inner surface of the wall either absorbs or reflects the part of light to reduce the divergence angle of the light. The electronic display 420 may also include an array of optical lenses. Each optical lens has a convex surface facing a LED and focuses the light emitted from the LED along its focal axis. The focusing by the optical lens further reduces the divergence angle of the light. The divergence angle of the light existing the optical lens is no larger than 20 degrees.

The optics block 430 magnifies received light from the electronic display 420, corrects optical errors associated with the image light, and the corrected image light is presented to a user of the near-eye display 400. The optics block 430 is an optical element, such as an aperture, a Fresnel lens, a convex lens, a concave lens, a filter, or any other suitable optical element that affects the image light emitted from the electronic display 420. Moreover, the optics block 430 may include combinations of different optical elements. In some embodiments, one or more of the optical elements in the optics block 430 may have one or more coatings, such as partial reflectors or anti-reflective coatings.

Magnification of the image light by the optics block 430 allows the electronic display 420 to be physically smaller, weigh less, and consume less power than larger displays.

Additionally, magnification may increase a field of view of the displayed media. For example, the field of view of the displayed media is such that the displayed media is presented using almost all (e.g., 110° diagonal), and in some cases all, of the user's instantaneous field of view. In some embodiments, the effective focal length the optics block 430 is larger than the spacing to the electronic display 420. Consequently, the optics block 430 magnifies the image light projected by the electronic display 420. Additionally, in some embodiments, the amount of magnification may be adjusted by adding or removing optical elements.

The optics block 430 may be designed to correct one or more types of optical error. Examples of optical error include: two dimensional optical errors, three dimensional optical errors, or some combination thereof. Two dimensional errors are optical aberrations that occur in two dimensions. Example types of two-dimensional errors include: barrel distortion, pincushion distortion, longitudinal chromatic aberration, transverse chromatic aberration, or any other type of two-dimensional optical error. Three-dimensional errors are optical errors that occur in three dimensions. Example types of three-dimensional errors include spherical aberration, chromatic aberration, field curvature, astigmatism, or any other type of three-dimensional optical error. In some embodiments, content provided to the electronic display 420 for display is pre-distorted, and the optics block 430 corrects the distortion when it receives image light from the electronic display 420 generated based on the content.

Figure 5A:
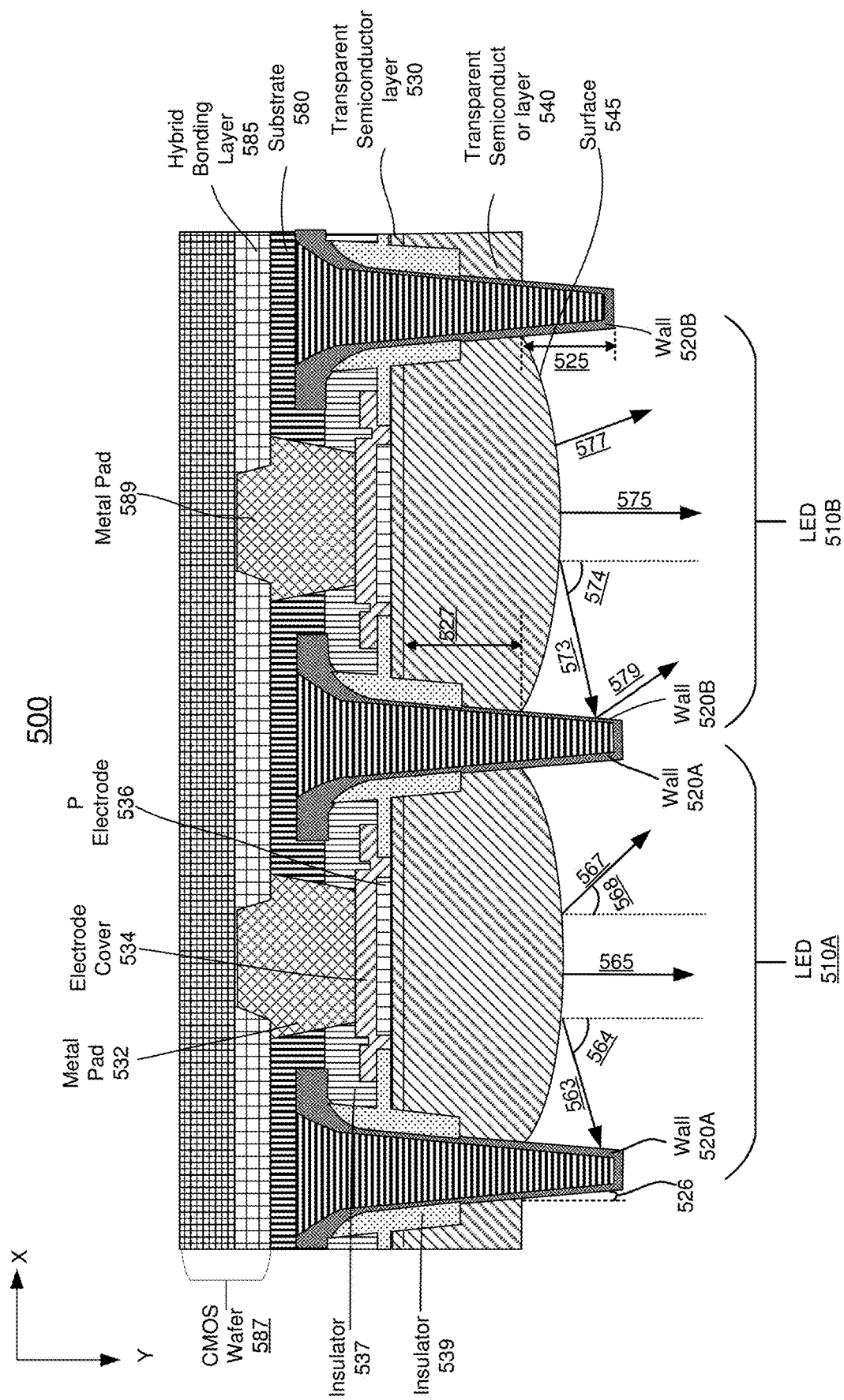
FIG. 5A illustrates a cross-sectional view of a display assembly, in accordance with one or more embodiments.
Figure 5B:
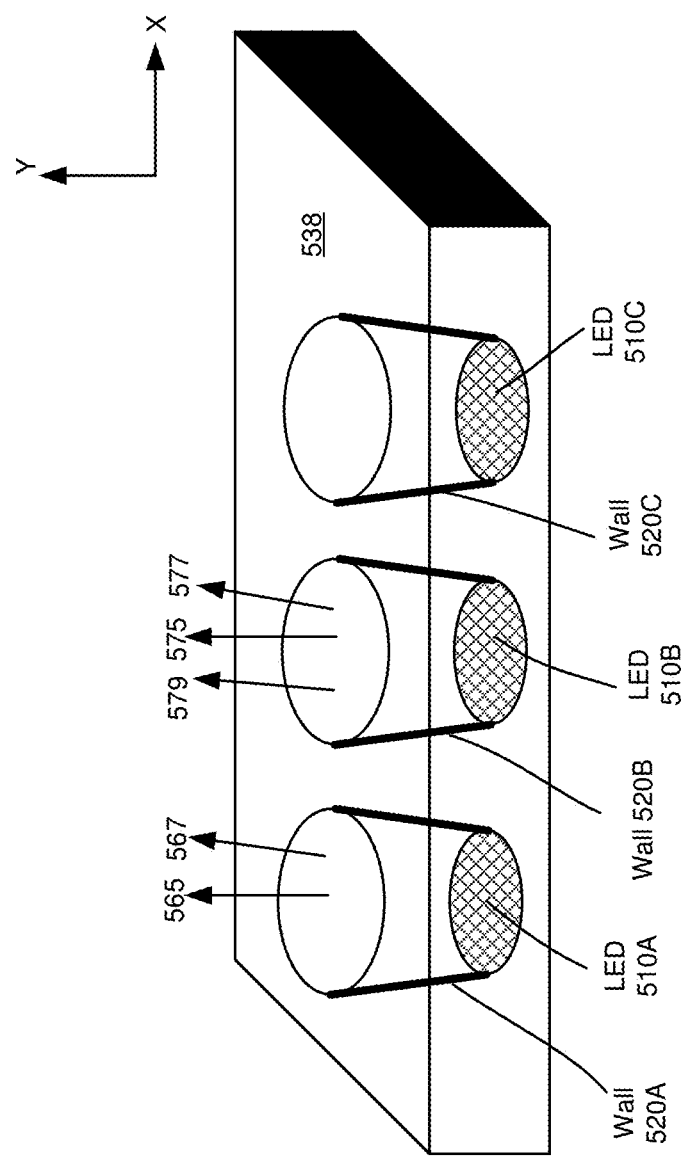
FIG. 5B illustrates a prospective view of the display assembly in FIG. 5A, in accordance with one or more embodiments.

FIG. 5A illustrates a cross-sectional view of a display assembly 500, in accordance with one or more embodiments. The display assembly 500 is an embodiment of the electronic display 420 in FIG. 4. The display assembly 500 includes two LEDs 510A, 510B (collectively referred to as LEDs 510 or individually as LED 510), walls 520A, 520B (collectively referred to as walls 520 or individually as wall 520), a substrate 580, and a CMOS (complementary metal-oxide-semiconductor) wafer 587. Other embodiments of the display assembly 500 may include different, additional, or fewer components. For example, the display assembly 500 includes a different number of LEDs 510 and walls 520. FIG. 5B illustrates a prospective view of the display assembly 500 in FIG. 5A, in accordance with one or more embodiments. For purpose of simplicity and illustration, FIG. 5B does not show all components of the display assembly 500.

Each of the LEDs 510 emits light when a potential difference is applied on it. The LEDs 510 include a transparent semiconductor layer 530 and another transparent semiconductor layer 540. As shown in FIG. 5A, each LED 510 comprises a part of transparent semiconductor layer 530 and a part of the transparent semiconductor layer 540.

In some embodiments, the transparent semiconductor layer 530 is a P-type semiconductor layer (e.g., P-type GaN layer) and the transparent semiconductor layer 540 is a N-type semiconductor layer (e.g., N-type GaN layer), or vice versa. In the embodiment of FIG. 5A, the semiconductor layer 530 and the semiconductor layer 540 are both transparent to light. Thus, the light can pass through the semiconductor layer 530 and the semiconductor layer 540 and exit the LEDs 510 from the surface 545 of the semiconductor layer 540. The surface 545 shown in FIG. 5A is curved. However, in some embodiments, the surface 545 is a roughen surface having a roughness above a threshold value or an etched surface for enhancing efficiency of light extraction. In some other embodiments, the surface 545 may be flat.

Each LED 510 in FIG. 5A includes a P electrode 536 and a N electrode, which facilitate application of electrical potential across the transparent semiconductor layers 530 and 540. In some embodiments, the N electrode of a LED 510 is a portion of the wall 520 corresponding to a LED 510 that is in contact with the transparent semiconductor layer 540. The wall 520 has a metal coating and can be connected to a power source. The portion of the wall 520, i.e., the N electrode, is electrically insulated from the transparent semiconductor layer 530 through an insulator 539. The insulator 539 may be made of SiN.

The P electrode 536 is made of Ag, Pd or ITO. The P electrode 536 is at least partially enclosed by an electrode cover 534. The electrode cover 534 can be made from Titanium Nitride (TiN), Titanium (Ti), Tungsten (W), or Platinum (Pt). The electrode cover 534 encloses the P electrode 536 to avoid diffusion of the P electrode 536. In one embodiment, the electrode cover 534 is a plane distributed Bragg reflector (DBR) arranged on top of the P electrode 536. The P electrode 536 can provide an electrical connection between the corresponding part of the transparent semiconductor layer 530 and a metal pad 532 on the substrate 580. The metal pad 532 may be made of, for example, Copper (Cu), Gold (Au), or Tungsten (W). The metal pad 532 is embedded in the substrate 580. As shown in FIG. 5A, the pads 532 are separated so that that the LEDs 510 can be individually addressed. In some embodiments, the substrate 580 is made from Silicon dioxide ($SiO_2$).

The substrate 580 is connected to the CMOS wafer 587 through a hybrid bonding layer 585. The hybrid bonding layer 585 is a combination of fusion bond (oxide to oxide bond) and eutectic bond (metal-based thermocompressive). The bonding between the metal pad 532 and metal pad 589 is the eutectic bond, and the bonding between the rest of the substrate 580 and the rest of the hybrid bonding layer 585 is the fusion bond. In one example, the hybrid bonding is formed by forming the fusion bond to hold the substrate 580 and the CMOS wafer together and then forming the eutectic bond.

The walls 520 collimate light beams emitted from the LEDs 510. Each wall 520 surrounds a corresponding LED 510. In the embodiment of FIG. 5B, each wall 520 has a shape of frustoconical shape surrounding the corresponding LED 510. In other embodiments, a wall can have different shapes (e.g., cylinder or cuboid) and may surround the corresponding LED. A wall 520 collimates the light beam emitted from its corresponding LED 510 by reflecting and/or absorbing some of the light beam emitted through the transparent semiconductor 540. After being collimated by the walls 520, the light us more focused (i.e., less diverged) along the Y direction.

The walls 520 absorb and/or reflect light rays reaching the walls 520. In some embodiments, light rays incident on the walls 520 have emission angles larger than a threshold emission angle. The emission angle of a light ray is an acute angle between the light ray and a line along the Y direction, i.e., the emission direction of the LED 510. In one embodiment, the threshold emission angle is an angle of 60 degrees or less. In some embodiments, the threshold emission angle is a 20-degree angle. In other words, light rays that have emission angles larger than the threshold emission angle are either absorbed or reflected by the walls 520. The threshold emission angle indicates the collimation effect of the walls 520. The threshold emission angle correlates to a height 525 of the walls 520. The height 525 is a distance from the surface 545 of the transparent semiconductor layer 540 to a top of the walls 520. When the height 525 increases, the threshold emission angle decreases and the collimation effect of the walls 520 is increased. In some embodiments, the height 525 is at least 0.8 micrometer. In one embodiment, the height 525 is in a range from one micrometer to three micrometers.

In one or more embodiment, the same metal coating materials on the walls 520 extend over the top surface of the transparent semiconductor layer 530 to form a conductive layer 538. The conductive layer 538 functions to connect the wall 520 with the N electrode.

In some embodiments, the threshold emission angle is the same as a collimation angle 526 of the walls 520. The collimation angle 526 is an acute angle between the walls 520 and a line along the Y direction. The collimation angle 526 correlates to the threshold emission angle and determines the collimation effect of the wall 520. With a larger collimation angle 526, the threshold emission angle is larger, so less light rays are reflected and/or absorbed by the wall 520, resulting in a weaker collimation effect. In contrast, a smaller collimation angle 526 correlates to a smaller threshold emission angle, resulting in more light rays being reflected and/or absorbed by the wall 520 and a stronger collimation effect. For this purpose, the collimation angle is between 0 and 5 degrees, e.g., 0 to 3 degrees, in embodiments where the wall 520 is configured to absorb light. In embodiments where the wall 520 is configured to reflect light, the collimation angle is in a range from 3 to 20 degrees, such as 10 to 20 degrees. In some embodiments, the collimation angle 526 is zero degree, i.e., the wall 520 is perpendicular to the top surface of the transparent semiconductor layer 530 (i.e., extends in the Y direction). All the walls 520 may have the same height 525 and the same collimation angle 526. Alternatively, the walls 520 may have different heights and/or collimation angles.

The collimation effect of the walls 520 is illustrated in FIG. 5A. For purpose of simplicity and illustration, FIG. 5A shows three light rays from the LED 510A and three light rays from the LED 510B. However, the LEDs 510 can emit more or fewer light rays. Also, the LEDs 510 can emit light rays in directions different from the directions of the light rays shown in FIG. 5A. For purpose of illustration, wall 520A is illustrated as being formed with a light absorptive coating and wall 520B is illustrated as being formed with a light reflective coating. However, in practice, all the walls 520 are formed of the same light reflective material or light absorbing material.

When the walls 520 are formed with a light absorptive coating that absorbs light, the wall 520A absorbs the light ray 563 that has an emission angle 564 larger than the threshold emission angle. The absorptive coating can be a layer of TiN, W, other types of material that can absorb light, or some combination thereof. As shown in FIG. 5A, light ray 565 has an emission angle of zero degree and the light ray 567 has an emission angle 568 that is smaller than the threshold emission angle, so they do not arrive at the wall 520 and are not absorbed. Rather, they exit the display assembly 500, as shown in FIG. 5B.

On the other hand, when the wall 520 is formed with a light reflecting coating, the walls 520 collimate light rays by reflecting them. The reflective coating can be a layer of a reflective material, e.g., Aluminum (Al), Ag, Copper (Cu), Gold (Au), Palladium (Pd), ITO, DBR, other types of reflective metal, or some combination thereof, and can have a mirror finish at its bottom surface. Light ray 573, which has an emission angle 574 larger than the threshold emission angle, reaches the reflective coating of the wall 520B and is reflected by the wall 520B, and thereby converts the light ray 573 to a light ray 579 having an emission angle smaller than the emission angle 574. In this way, the divergence of light emitted by the LED 510B in the Y direction can be reduced. The light rays 575 and 575 exit the display assembly 500 without being reflected by the wall 520, as shown in FIG. 5B.

Thus, through the absorption or the reflection, the walls 520 prevent light rays having emission angles larger than the threshold emission angle from exiting the display assembly 500 but allows the other light rays to exit the display assembly 500, resulting in reduction in the divergence of the light rays.

Figure 6:
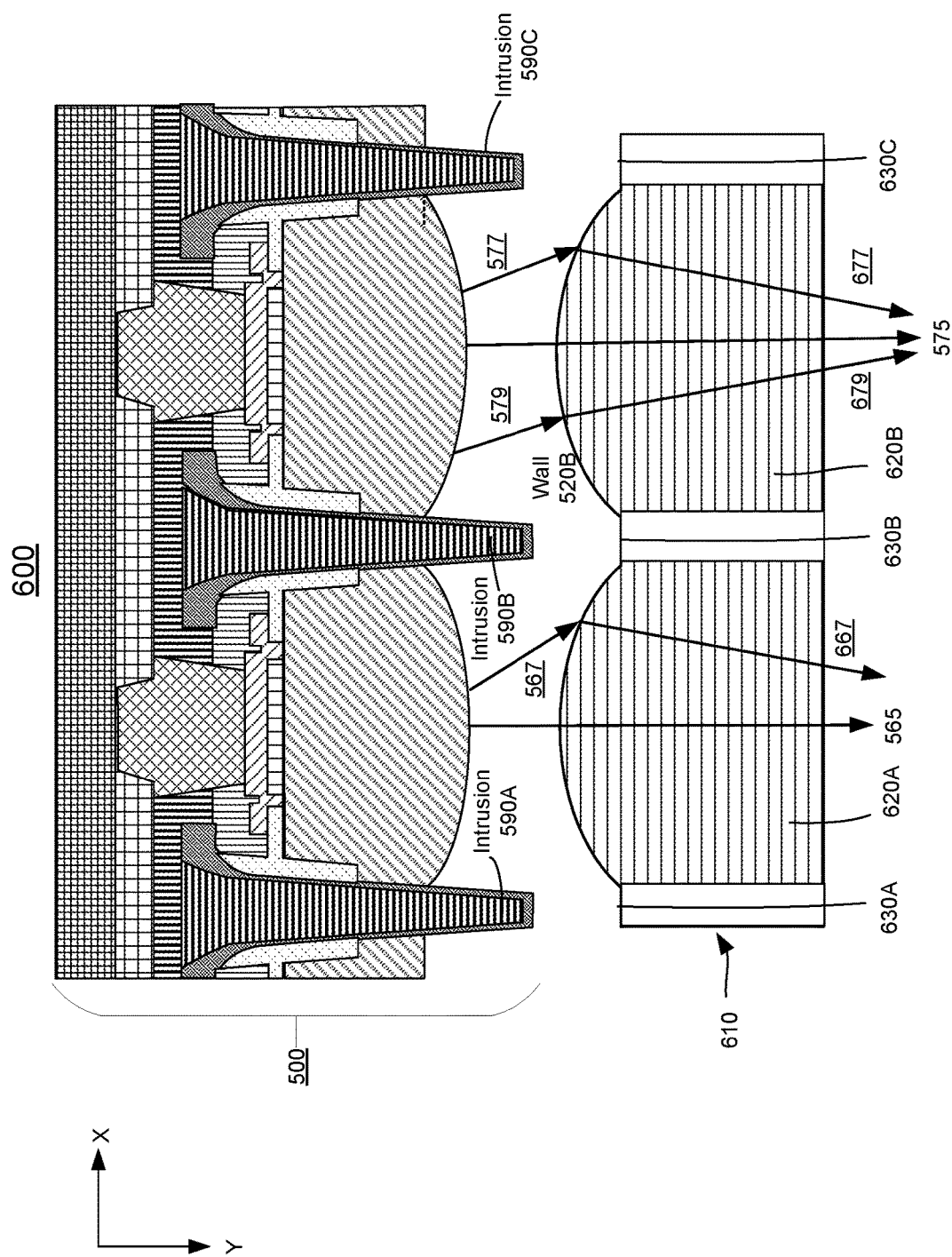
FIG. 6 illustrates a cross-sectional view of another display assembly, in accordance with one or more embodiments.

FIG. 6 illustrates a cross-sectional view of another display assembly 600, in accordance with one or more embodiments. The display assembly 600 includes the display assembly 500 described above in conjunction with FIGS. 5A and 5B. Additionally, the display assembly 600 includes an optical lens array 610 that includes a plurality of optical lenses 620A, 620B (collectively referred to as optical lenses 620 or individually as optical lens 620). The display assembly 600 is an embodiment of the electronic display 420 in FIG. 4. For purpose of simplicity and illustration, FIG. 6 shows two optical lenses 620. However, the array 610 can include a different number of optical lenses 620.

Each optical lens 620 has a convex surface facing a portion of the surface 545 of the transparent semiconductor layer 540 that corresponds to a LED 510. Each optical lens has an optical axis along the Y direction. The light rays emitted from the LED 510 arrives at the optical lens 620 and are focused by the optical lens 620 along its optical axis. As illustrated in FIG. 6, the light rays 565 and 575 arrive at the optical lenses 620A and 620B, respectively. The light rays 565 and 575 are not changed by the optical lens 620A because they are in the direction of the optical axis of the optical lens 620A. However, the optical lens 620A refract the light ray 567 into a light ray 667. Similarly, the light rays 577 and 579 are refracted into light rays 677 and 679, respectively, by the optical lens 620B. Each of the refracted light rays 667, 677, and 679 that exit the optical lens array 610 have emission angles smaller than its counterpart light rays 567, 577, or 579. Thus, the divergence in the light beams emitted by the LEDs 510 is further reduced by the optical lens array 610. In some embodiments, the optical lens array 610 can increase the collimation effect by approximately 40%. For instance, compared with the light rays exiting the walls 520, more light rays (e.g., 40% more) exiting the optical lens array 610 have emission angles of 20 degrees or less. Also, the full width at half maximum (FHWM) of the distribution of the light exiting the optical lens array 610 is improved compared with the light exiting the walls 520. In some embodiments, the FHWM can be reduced from 90 degrees to 70 degrees.

The optical lens array 600 is formed with indentations 630A, 630B, 630C (collectively referred to as indentations 630 or individually as indentation 630) between the optical lenses 620 to receive the walls 520 for aligning the array with the LEDs. Each indentation 630 is formed between two optical lenses 620. For instance, the indentation 630B is formed between the optical lenses 620A and 620B. The indentations 630 are configured to receive intrusions 590A-C (collectively referred to as intrusions 590 or intrusion 590), each instruction 590 formed by two neighboring walls 520. For instance, the indentation 630B receives the intrusion 590B that is formed by a part of the wall 520A and a part of the wall 520B. When the indentations 630 receive the intrusion 590, there is an air gap between the LEDs 510 and the optical lenses 620 due to the height 525 of the walls 520. In this way, the optical lenses 620 can efficiently collimate the light.

Figure 7A:
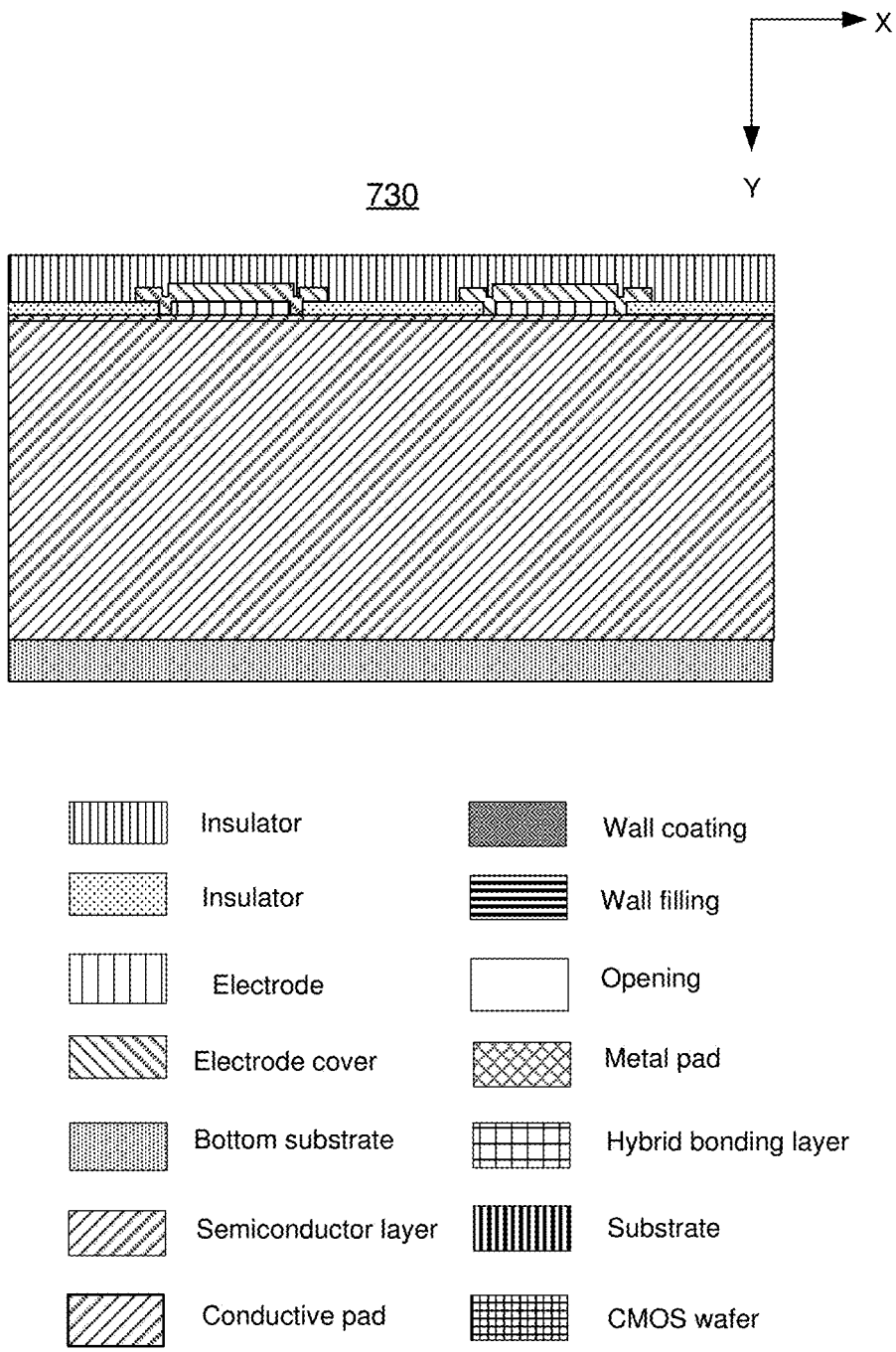
FIGS. 7A through 7I illustrate the process of forming a display assembly, in accordance with one or more embodiments.

FIGS. 7A though 7I illustrate the process of forming a display assembly 700, in accordance with one or more embodiments. The display assembly 700 is shown in FIG. 7J. The display assembly 700 is an embodiment of the display assembly 500 in FIGS. 5A and 5B.

The formation of the display assembly 700 starts with an assembly 730 shown in FIG. 7A. The assembly 740 that includes two layers of insulator, electrodes, electrode covers, two transparent semiconductor layers, and a bottom substrate. The transparent semiconductor layer in contact with the bottom substrate is referred to as the bottom transparent semiconductor layer, and the other transparent semiconductor layer is referred to as the top transparent semiconductor layer. In some embodiments, each insulator is an electrically insulating material, such as SiN or other types of insulating materials.

Each P electrode is electrically conductive and is made of materials such as Ti, N, TiN, or other types of metals, alloys, or conductive materials. Each electrode cover is made from TiN, Ti, W, Pt, DBR, or some combination thereof. The transparent semiconductor layers are layers of a semiconductor materials (e.g., GaN) that are transparent to light. One of the transparent semiconductor layers is a N-type semiconductor layer, and the other one of the transparent semiconductor layers is a P-type semiconductor layer. In some embodiments, the N-type semiconductor layer is on top of the quantum well. In some other embodiments, the P-type semiconductor layer is on top of the quantum well. The bottom substrate is a wafer on which the other components of the assembly 700 are built. It can be a silicon growth wafer, e.g., on which silicon crystals are grown to form the transparent semiconductor layers and the quantum well.

Figure 7B:
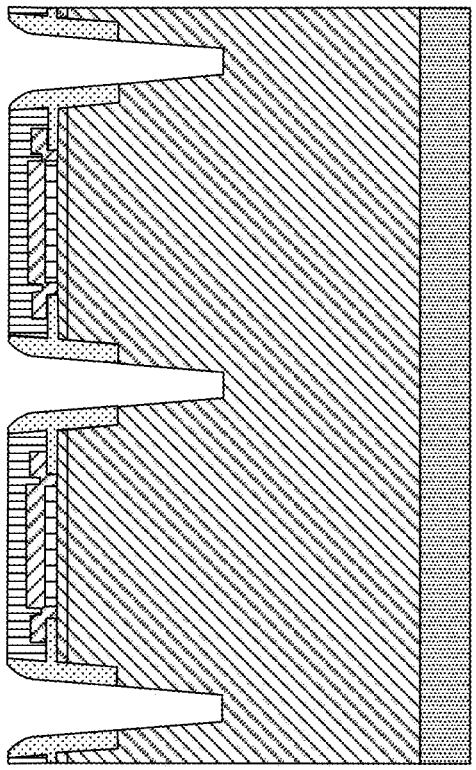

As shown in FIG. 7B, openings are formed along the Y direction, e.g., by dry etching. Each opening extends through the insulator layers, the top transparent semiconductor layer, and a part of the bottom transparent semiconductor layer. In some embodiments, the distance from each opening to an adjacent electrode in the direction along the X axis is the same. The two openings define the LED 710, which includes the portion of the assembly 730 between the two openings. Each opening can be in a shape of cone, cylinder, or cuboid.

Figure 7C:
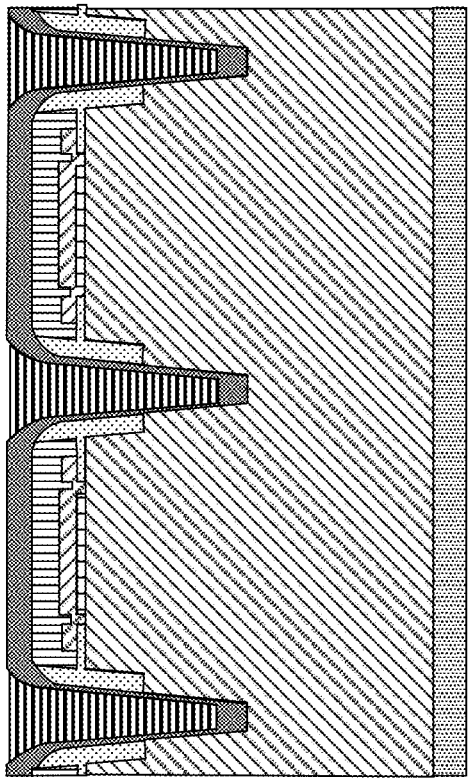

As shown in FIG. 7C, more of the bottom transparent semiconductor layer is removed, e.g., by dry etching, to make trenches. Also, insulator is added in the insulator layers, the top transparent semiconductor layer, and part of the transparent semiconductor layer along a portion of the edge of each opening. In the embodiment of FIG. 7C, a distance from a bottom surface of the added insulator to a bottom surface of each opening along the Y direction is at least 1 micrometer. In some embodiments, the distance is at least the size of a pixel pitch of the display assembly 700. The pixel pitch is a distance between two neighboring pixels and indicates density of pixels in the display assembly 700. In one embodiment, the pixel pitch is 4 micrometer.

Figure 7D:
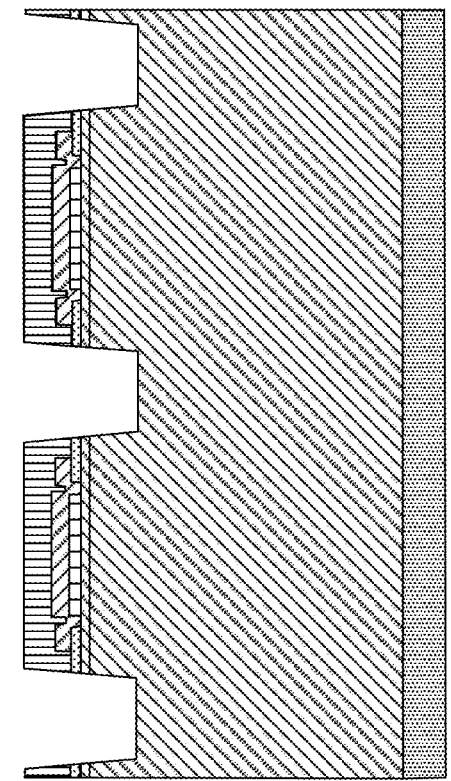

As shown in FIG. 7D, a metal coating is formed on inner surfaces of the openings as well as portions of a top surface of the top insulator layer. The metal coating can be a layer of materials such as Ti, Al, Ag, Au, Cu, W or TiN, or any combination thereof. In some embodiments, the metal coating is formed through deposition techniques, such as thermal deposition, physical vapor deposition, ion beam deposition, chemical vapor deposition, or electroplating. The metal coating can be polished through chemical mechanical polishing. The metal coating constitutes the wall 720. At least some of the metal coating that contacts directly with a portion the bottom transparent semiconductor layer (i.e., the metal coating is not separated from the portion of the bottom transparent semiconductor layer by the insulator) can operate as a conductor to electrically ground the bottom transparent semiconductor layer.

Figure 7E:
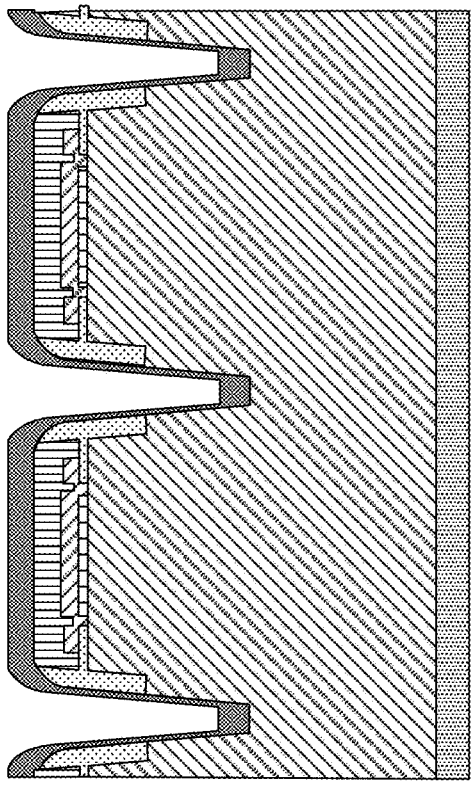
Figure 7F:
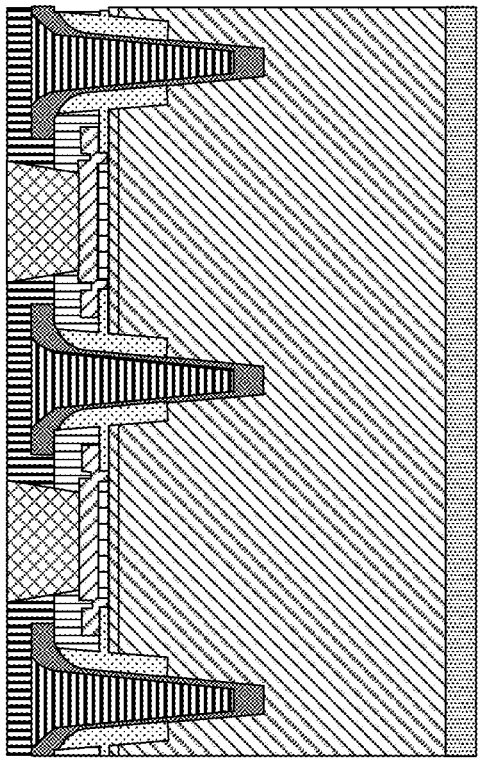

In FIG. 7E, the openings are filled with a material, e.g., ITO. In FIG. 7F, some of the metal coating formed on the top surface of the insulator layer are removed, e.g., by etching.

Figure 7G:
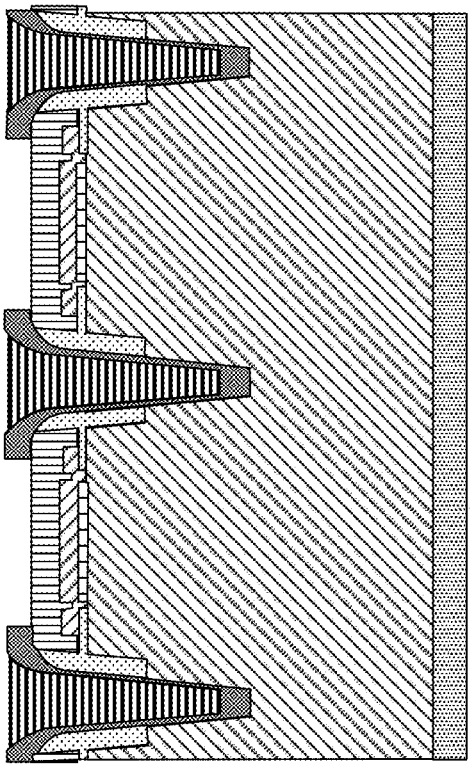

As shown in FIG. 7G, the substrate is attached to the top portion the insulator layer (the portion from which the metal coating is removed in FIG. 7F) and some of the metal coating formed on the top of the insulator layer that is not removed in FIG. 7F. Also, a metal pad is formed between the two filled openings. The metal pad extends through the substrate in the Y direction and contacts the top surface of the electrode cover.

Figure 7H:
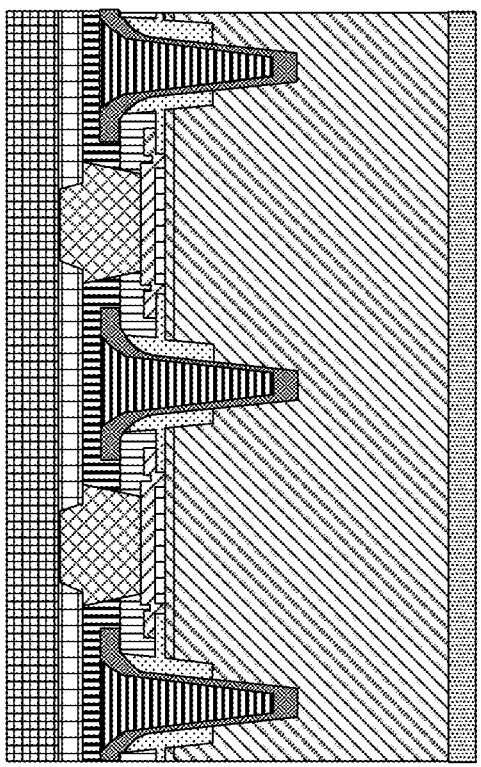
Figure 7I:
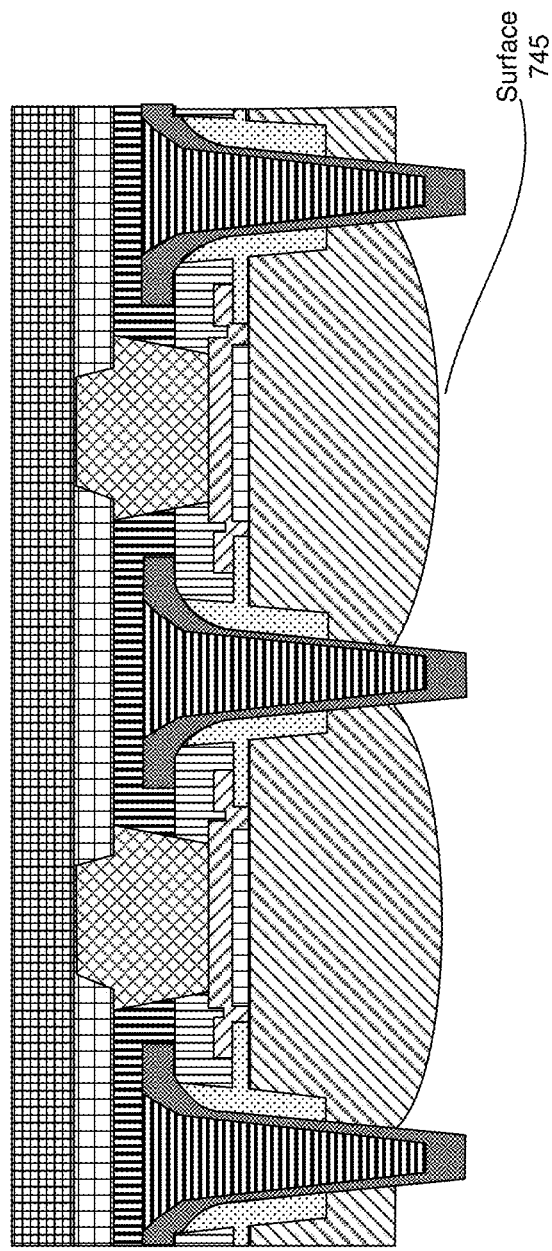

FIG. 7H illustrates attaching a CMOS wafer onto the substrate through a hybrid bonding layer. The hybrid bonding layer includes metal pads embedded in a layer of $SiO_2$. The $SiO_2$ in the hybrid bonding and the $SiO_2$ in the substrate form oxide-oxide bonding (fusion bonding). The metal pads in the hybrid bonding layer and the metal pads in the substrate form metal-metal bonding (eutectic bonding). The display assembly 700 is formed in FIG. 7I. In FIG. 7I, the bottom substrate and the portion of the bottom transparent semiconductor layer are removed by etching, e.g., dry etching, to form a surface 745.

Figure 8:
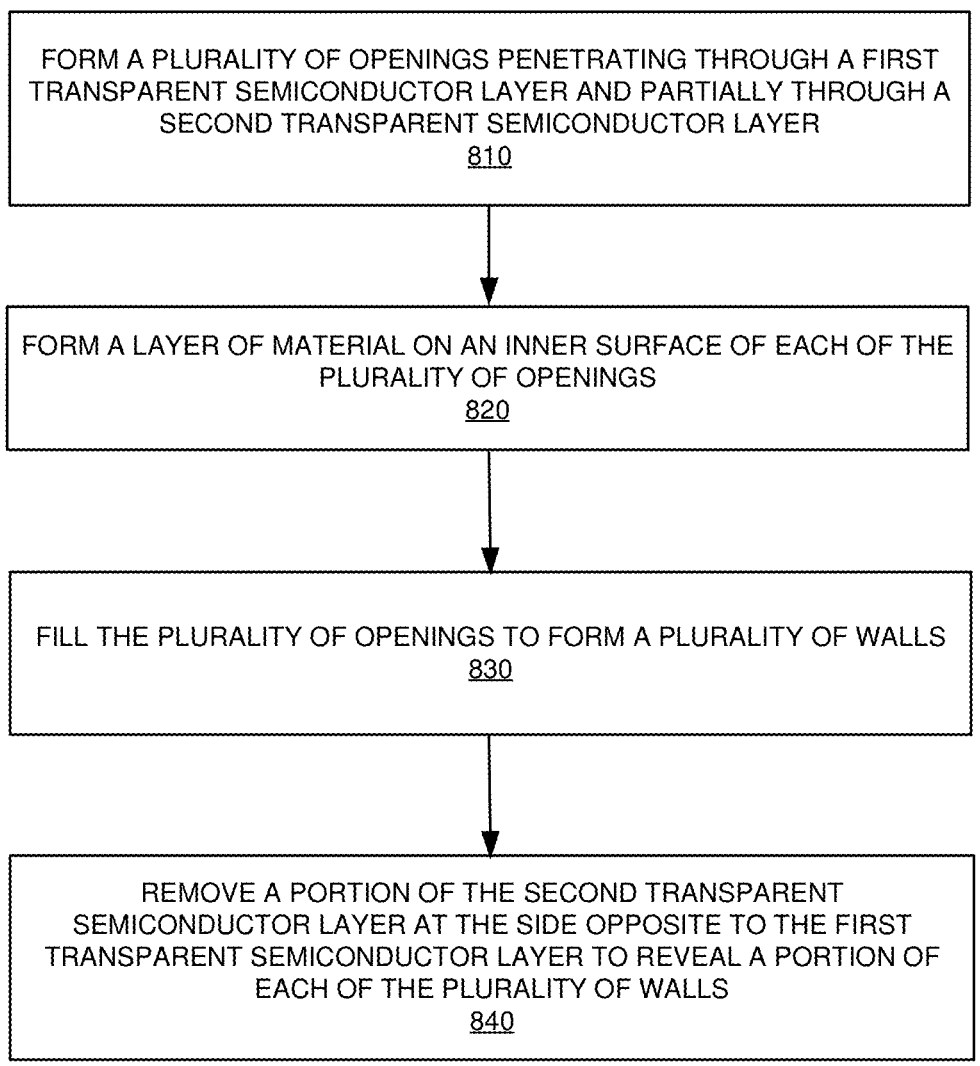
FIG. 8 is a flowchart illustrating a method of forming a display assembly, in accordance with an embodiment.

FIG. 8 is a flowchart illustrating a method of forming a display assembly, in accordance with an embodiment. First, a plurality of openings penetrating through a first transparent semiconductor layer and partially through a second transparent semiconductor layer is formed 810. A layer of material is formed 820 on an inner surface of each of the plurality of openings. The metal can be aluminum, copper, silver, gold, tin, or tungsten. In some embodiments, the layer is deposited on the surface of each of the plurality of openings. The plurality of openings are then filled 830 to form a plurality of walls. The openings are filled with a material. In some embodiments, the material is an oxide material, such as indium tin oxide. Each wall collimates light by reflecting and/or absorbing light incident on the coating.

A portion of the second transparent semiconductor layer at the side opposite to the first transparent semiconductor layer is removed 840 to reveal a portion of each of the plurality of walls. In some embodiments, the portion of the second transparent semiconductor layer is removed by performing a selectively etching process in which the portion of the N-type semiconductor layer is etched but the plurality of walls are not etched.

Figure 9:
FIG. 9 is a flowchart illustrating a method of collimating light in a display assembly, in accordance with an embodiment.

FIG. 9 is a flowchart illustrating a method of collimating light in a display assembly, in accordance with an embodiment. The method is performed by a display assembly, such as the display assembly 500, 600, or 700 described above.

The display assembly 500, 600, or 700 emits light through a surface of a transparent semiconductor layer by a plurality of LEDs. The plurality of LEDs comprise a part of the transparent semiconductor layer.

The display assembly 500, 600, or 700 collimates the light emitted by the plurality of LEDs by walls. The walls extend through the transparent semiconductor layer and beyond the surface of the transparent semiconductor layer. In some embodiments, each wall corresponds to one of the LEDs and surrounds a least a part of the LED. In some embodiments, each wall including a metal coating. The metal coating can be a layer of aluminum, silver, gold, copper, tungsten, tin, other metals or alloys, or some combination thereof. Each wall can delivery electrical power to the corresponding LED through its metal coating. The wall for a LED reflects the light emitted by the LED, e.g., by the metal coating of the wall. Additionally or alternatively, the wall absorbs a part of the light with incident angle greater than a predetermined angle. In one example, the predetermined angle is 20 degrees. The display assembly 600 further collimates the light emitted from the LEDs by an array of optical lenses facing the surface of the transparent semiconductor layer.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

What is claimed is:

1. A display device, comprising:
    a plurality of light emitting diodes (LEDs) comprising a part of a transparent semiconductor layer, each of the plurality of LEDs configured to emit light through a surface of the transparent semiconductor layer; and
    walls extending through the transparent semiconductor layer and beyond the surface of the transparent semiconductor layer, each of the walls surrounding at least part of each of the plurality of LEDs to collimate the light emitted by the plurality of LEDs.

2. The display device of claim 1, wherein each of the walls comprises a metal coating to collimate the light.

3. The display device of claim 2, wherein at least a subset of the walls is electrically connected to an electrode.

4. The display device of claim 1, wherein the walls collimate the light emitted by the plurality of LEDs by reflecting the light.

5. The display device of claim 4, wherein each of the walls is coated or formed of a metal selected from a group consisting of aluminum, copper, silver, and gold.

6. The display device of claim 1, wherein the walls are configured to absorb a part of the light with an incident angle greater than a predetermined angle.

7. The display device of claim 6, wherein each of the plurality of walls comprises Titanium Nitride or Tungsten.

8. The display device of claim 1, further comprising:
    an array of optical lenses facing the surface of the transparent semiconductor layer to further collimate the light emitted from the LEDs.

9. The display device of claim 8, wherein the array is formed with indentations between the optical lenses to receive the walls for aligning the array with the LEDs.

10. The display device of claim 1, wherein at least a subset of the walls comprises a color converting material.

11. A method comprising:
    forming a plurality of openings penetrating through a first transparent semiconductor layer and partially through a second transparent semiconductor layer attached to the first transparent semiconductor layer;
    forming a layer of material on an inner surface of each of the plurality of openings;
    filling the plurality of openings to form a plurality of walls; and
    removing a portion of the second transparent semiconductor layer at an opposite side of the first transparent semiconductor layer to reveal a portion of each of the plurality of walls.

12. The display device of claim 11, wherein forming a layer of material on an inner surface of each of the plurality of openings comprises:
    depositing the layer of material on the surface of each of the plurality of openings.

13. The display device of claim 11, wherein filling the plurality of openings to form the plurality of walls comprises:
    filling the plurality of openings with an oxide material.

14. The method of claim 13, wherein the oxide material is indium tin oxide.

15. The display device of claim 11, wherein removing a portion of the second transparent semiconductor layer at an opposite side of the first transparent semiconductor layer to reveal a portion of each of the plurality of walls comprises:
    performing a selectively etching process to remove the portion of the second semiconductor layer but retain the plurality of walls.

16. A method comprising:
    emitting light through a surface of a transparent semiconductor layer by a plurality of light emitting diodes (LEDs) comprising a part of the transparent semiconductor layer; and
    collimating the light emitted by the plurality of LEDs by walls extending through the transparent semiconductor layer and beyond the surface of the transparent semiconductor layer.

17. The method of claim 16, further comprising:
    delivering electrical power to the LEDs through a metal coating of each of the walls.

18. The method of claim 16, wherein collimating the light emitted by the plurality of LEDs by walls extending through the transparent semiconductor layer and beyond the surface of the transparent semiconductor layer comprises:
    reflecting light rays of the light that have emission angles greater than a threshold emission angle by a coating of each of the walls.

19. The method of claim 16, wherein collimating the light emitted by the plurality of LEDs by walls extending through the transparent semiconductor layer and beyond the surface of the transparent semiconductor layer comprises:
    absorbing light rays of the light that have emission angles greater than a threshold emission angle by a coating of each of the walls.

20. The method of claim 16, further comprising:
    further collimating the light emitted from the LEDs by an array of optical lenses facing the surface of the transparent semiconductor layer.

* * * * *

UNITED STATES PATENT AND TRADEMARK OFFICE
CERTIFICATE OF CORRECTION

| | | |
|---|---|---|
| PATENT NO. | : 11,508,890 B2 | Page 1 of 1 |
| APPLICATION NO. | : 17/214727 | |
| DATED | : November 22, 2022 | |
| INVENTOR(S) | : Mohsin Aziz et al. | |

It is certified that error appears in the above-identified patent and that said Letters Patent is hereby corrected as shown below:

In the Claims

In Column 18, Claim 12, Line 11, delete "The display device of" and insert -- The method of --, therefor.

In Column 18, Claim 13, Line 16, delete "The display device of" and insert -- The method of --, therefor.

In Column 18, Claim 15, Line 23, delete "The display device of" and insert -- The method of --, therefor.

Signed and Sealed this
Twenty-fifth Day of April, 2023

Katherine Kelly Vidal
*Director of the United States Patent and Trademark Office*